(12) United States Patent
Fehling et al.

(10) Patent No.: US 11,747,221 B2
(45) Date of Patent: Sep. 5, 2023

(54) ELECTRICAL MULTI-DIRECTIONAL FORCE SENSOR

(71) Applicant: KOSTAL Automobil Elektrik GmbH & Co. KG, Luedenscheid (DE)

(72) Inventors: Andre Fehling, Sundern (DE); Matthias Seifert, Bochum (DE); Alexander Kaul, Hagen (DE); Michael Bleckmann, Schwerte-Ergste (DE); Kai Brensel, Witten (DE); Guido Huperz, Olpe (DE)

(73) Assignee: Kostal Automobil Elektrik GmbH & Co. KG, Luedenscheid (DE)

( * ) Notice: Subject to any disclaimer, the term of this patent is extended or adjusted under 35 U.S.C. 154(b) by 227 days.

(21) Appl. No.: 17/396,915

(22) Filed: Aug. 9, 2021

(65) Prior Publication Data

US 2021/0364373 A1 Nov. 25, 2021

Related U.S. Application Data

(63) Continuation of application No. PCT/EP2020/056469, filed on Mar. 11, 2020.

(30) Foreign Application Priority Data

Mar. 13, 2019 (DE) .................. 10 2019 001 769.2

(51) Int. Cl.
*G01L 1/14* (2006.01)
*G01D 5/24* (2006.01)

(52) U.S. Cl.
CPC ............ *G01L 1/144* (2013.01); *G01D 5/2403* (2021.05)

(58) Field of Classification Search
CPC .... G01L 1/144; G01D 5/2403; H03K 17/975; H03K 17/98
See application file for complete search history.

(56) References Cited

U.S. PATENT DOCUMENTS 5,576,704 A * 11/1996 Baker .................. G05G 9/047
341/20
5,911,627 A 6/1999 Piot et al.
(Continued)

FOREIGN PATENT DOCUMENTS

DE 102014014021 A1 3/2016
EP 3279761 A1 2/2018

OTHER PUBLICATIONS

European Patent Office, International Search Report for International Application No. PCT/EP2020/056469, dated Jun. 18, 2020.
(Continued)

*Primary Examiner* — Octavia Davis Hollington
(74) *Attorney, Agent, or Firm* — Brooks Kushman P.C.

(57) ABSTRACT

An electrical multidirectional force sensor includes a sensor element having a sensor pin and a sensor plate and a circuit board. The sensor pin is movable in at least two actuation directions. The sensor plate is integrally connected to multiple strip-shaped support elements. Each strip-shaped support element has an end portion with an opening. The sensor plate and the strip-shaped support elements are cut free in one piece from a metal plate. The sensor plate is connected to the sensor pin to move relative to the circuit board in correspondence with movement of the sensor pin.

20 Claims, 1 Drawing Sheet

(56) References Cited

U.S. PATENT DOCUMENTS

| | | | |
|---|---|---|---|
| 6,248,018 B1 * | 6/2001 | Kehlstadt | G05G 9/047 345/161 |
| 2002/0058104 A1 | 5/2002 | Chen | |
| 2021/0354596 A1 * | 11/2021 | Fehling | G05G 9/04785 |

OTHER PUBLICATIONS

German Patent and Trademark Office, German Search Report for German Patent Application No. 10 2019 001 769.2, dated Jan. 24, 2020.

The International Bureau of WIPO, International Preliminary Report on Patentability for International Application No. PCT/EP2020/056469, dated Aug. 25, 2021.

* cited by examiner

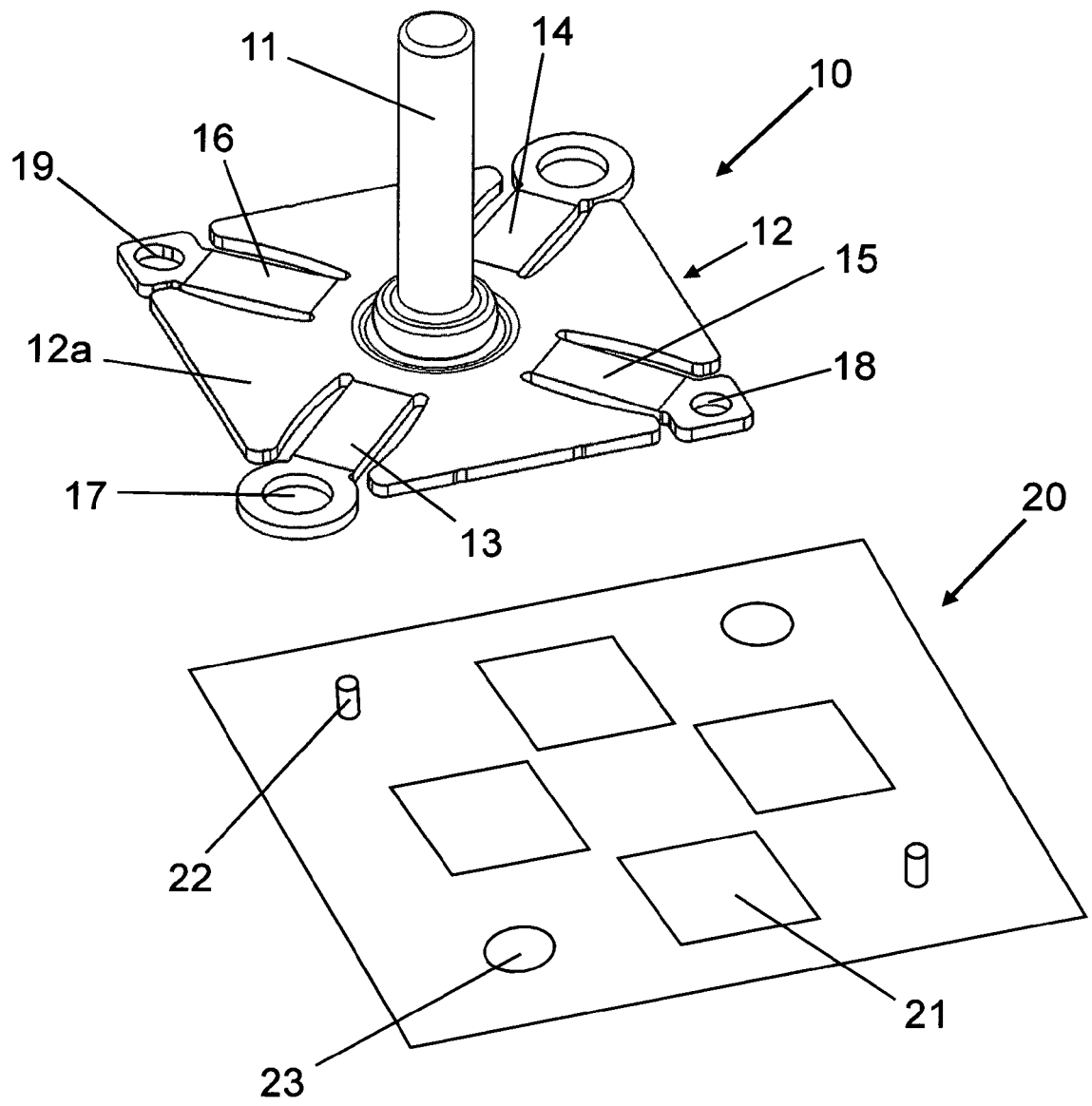

ELECTRICAL MULTI-DIRECTIONAL FORCE SENSOR

CROSS-REFERENCE TO RELATED APPLICATIONS

This application is a continuation of International Application No. PCT/EP2020/056469, published in German, with an International filing date of Mar. 11, 2020, which claims priority to DE 10 2019 001 769.2, filed Mar. 13, 2019, the disclosures of which are hereby incorporated by reference herein.

TECHNICAL FIELD

The present invention relates to an electrical multidirectional force sensor having a sensor pin, a sensor plate, and a circuit board, the sensor pin being movable (pivotable, swivel-able, etc.) from a neutral position in at least two actuating directions and the sensor pin moves back to the neutral position when an actuating force is discontinued, the sensor plate being connected to the sensor pin and being movable (pivotable, swivel-able, etc.) against the circuit board via movement of the sensor pin, and the circuit board having an electrical measuring system whose output signal depends on the position of the sensor plate relative to the circuit board.

The components of the electrical multidirectional force sensor that are not a direct part of the circuit board are referred to below as a sensor element.

BACKGROUND

These types of multidirectional force sensors are used in particular as input elements, for example, in seat adjustment switches in motor vehicles. A detection device in the form of a capacitive multidirectional force sensor is known from the published German Patent Application DE 10 2014 014 021 A1, which is hereby incorporated by reference in its entirety.

The multidirectional force sensor described in DE 10 2014 014 021 A1 has a sensor pin that is rigidly connected to the upper part of a housing. The sensor pin is connected to a metal or metal-coated sensor plate inside the housing. When the sensor pin is swiveled, the sensor plate at the same time pivots against metal-coated, conductive surfaces on a circuit board. Consequently, capacitance values of capacitors formed by the arrangement of the sensor plate and the conductive surfaces change with the swiveling motion of the sensor pin. Since the upper part of the housing has to be elastically deformed at the same time in order to swivel the sensor pin, the multidirectional force sensor is quite rigid, which for many applications such as seat adjustment switches is desirable.

The sensor element of the multidirectional force sensor described in DE 10 2014 014 021 A1 may advantageously be manufactured completely or mostly as an injection-molded part in which at least the housing and the sensor pin are made in one piece from a plastic. Although a design of this sensor element completely made of metal is possible, this entails a comparatively high level of manufacturing effort due to the difficulty in demolding the housing. In addition, for some applications, in particular in motor vehicles, relatively large space requirements for the housing are disadvantageous.

SUMMARY

An object is to provide a generic, particularly simple, inexpensive, and compact electrical multidirectional force sensor having a simple, inexpensive, and compact sensor element made entirely of metal.

Embodiments of the present invention provide an electrical multi-directional (multi-dimensional; multi-way) force sensor having a sensor pin, a sensor plate, and a circuit board. The sensor pin is movable (pivotable, swivel-able, etc.) from its neutral position in at least two actuation directions. The sensor pin moves back into its neutral position in the absence of an actuation force on the sensor pin. The sensor plate is connected to the sensor pin and pivots (moves, swivels, etc.) relative to the circuit board in correspondence with the movement of the sensor pin. The circuit board has an electrical measurement system whose output signal depends on the position of the sensor plate. The sensor plate is integrally connected to multiple strip-shaped support elements. Each strip-shaped support element has an end section in the form of a boss. The sensor plate and the strip-shaped support elements are cut free in one piece from a metal plate.

In carrying out at least one of the above and/or other objects, a multidirectional force sensor having a sensor pin, a sensor plate, and a circuit board is provided. The sensor pin is movable in at least two actuation directions. The sensor plate is integrally connected to multiple strip-shaped support elements. Each strip-shaped support element has an end portion with an opening. The sensor plate and the strip-shaped support elements are cut free in one piece from a metal plate. The sensor plate is connected to the sensor pin to move relative to the circuit board in correspondence with movement of the sensor pin.

The sensor pin may be metallic. In this case, the sensor pin and the sensor plate may be made of a same type of metal.

The sensor pin may be movable from a neutral position in the at least two actuation directions and the sensor pin moves to the neutral position when an actuating force is discontinued.

The sensor plate may move against the circuit board in moving relative to the circuit board in correspondence with movement of the sensor pin.

The circuit board may have an electrical measuring system configured to detect a position of the sensor plate relative to the circuit board.

In embodiments, the circuit board has conductor surfaces thereon. Capacitances between the sensor plate and the conductor surfaces on the circuit board depend on a position of the sensor plate relative to the circuit board whereby the position of the sensor plate is detectable from the capacitances between the sensor plate and the conductor surfaces on the circuit board. In this case, the sensor plate may move against the conductor surfaces on the circuit board in moving relative to the circuit board in correspondence with movement of the sensor pin.

The opening of the end portion of each of at least two of the strip-shaped support elements may form a screw eye. The screw eye is for screwing the sensor plate to the circuit board.

The opening of the end portion of each of at least one of the strip-shaped support elements may form a centering eye. The centering eye cooperates with a centering pin of the circuit board for aligning the sensor plate relative to the circuit board. The centering eye may be an elongated hole.

In embodiments, the opening of the end portion of each of at least two of the strip-shaped support elements forms a screw eye and the opening of the end portion of each of at least another one of the strip-shaped support elements forms a centering eye. Each screw eye is screwed to the circuit board and each centering eye cooperates with a centering pin of the circuit board.

The metal plate may originally have a rectangular design, and the strip-shaped support elements may be cut free in directions of diagonals of the metal plate.

Further, in carrying out at least one of the above and/or other objects, a multidirectional force sensor having a circuit board and a sensor element is provided. The sensor element has a sensor pin and a sensor plate. The sensor plate is movable relative to the circuit board in correspondence with the sensor pin being actuated by an operator. The sensor plate is integrally connected to multiple strip-shaped support elements. Each strip-shaped support element has an end portion with an opening. The sensor plate and the strip-shaped support elements are cut free in one piece from a metal plate.

In embodiments of the present invention, the sensor plate is integrally connected to multiple strip-shaped support elements, each strip-shaped support element has an end portion designed as an eye, and the sensor plate and the strip-shaped support elements are cut free in one piece from a metal plate.

The sensor plate and the strip-shaped support elements may be cut free from a single, preferably rectangular or in particular square, metal plate, preferably using a punching or stamping process.

An approximately cloverleaf-shaped sensor plate having four sensor wings, oppositely situated in pairs, thus remains between the strip-shaped support elements.

The strip-shaped support elements being integrally connected to the sensor plate allow a particularly simple arrangement of the sensor plate, either at an attachment site or mounting location opposite from the circuit board or preferably directly on the circuit board.

The strip-shaped support elements are used as fixing elements for fastening the sensor plate to the circuit board and as centering elements for precisely aligning the sensor plate with the circuit board. For this purpose, the end portions of the strip-shaped support elements form either screw eyes (screw-on eyes) or centering eyes into which either screws or centering pins are inserted accordingly.

It is advantageous for at least two of the strip-shaped support elements to be designed as fixing elements having screw eyes. For a strip-shaped support element that is provided as a centering element, it is advantageous for the centering eye to be designed as an elongated hole.

A complete sensor element is created from connecting the sensor plate in its center to a vertically protruding sensor pin. Since this sensor element has no parts such as a housing that are difficult to demold, it may be manufactured completely of metal in a simple and cost-efficient manner. The construction from metal facilitates a particular rigid design of a multidirectional force sensor, at the same time with a simple structure.

The sensor element via its strip-shaped support elements may be directly connected to the circuit board. Electrical components for detecting the shifting of the sensor plate in correspondence with movement of the sensor pin are situated on the circuit board. The measuring system thus formed may preferably be made up of multiple conductor surfaces that are situated on the circuit board. The conductor surfaces together with the sensor wings of the sensor plate form capacitors whose capacitances and changes in capacitance may be ascertained in order to determine the shifting of the sensor plate. However, the changes in distance may also be determined using measuring principles (by means of optical methods, for example) other than by the detection of capacitance values.

Swiveling of the sensor pin results in tilting of the sensor wings of the sensor plate relative to the strip-shaped support elements. The tilting of the sensor wings changes (particularly, increases or decreases) the distance between the sensor wings and the conductor surfaces situated on the circuit board. The magnitude of the changes in distance is a measure of the introduced force, which may be determined using an electronics system, not described in greater detail herein.

The arrangement of four sensor wings ensures that at least four actuation directions may be detected using only one sensor element.

BRIEF DESCRIPTION OF THE DRAWINGS

An exemplary embodiment of the present invention is explained in greater detail below with reference to the drawing, which shows the following:

FIG. 1 illustrates an exploded view of an electrical multidirectional force sensor in accordance with embodiments of the present invention.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Referring now to FIG. 1, an electrical multidirectional force sensor in accordance with embodiments of the present invention is shown. The multidirectional force sensor functions according to the capacitive measuring principle.

The multidirectional force sensor includes a sensor element 10 and a circuit board 20. Sensor element 10 is a metallic sensor element that is made up of metal. Circuit board 20 includes a plurality of metallic conductor surfaces 21 mounted thereon.

Sensor element 10 has a sensor pin 11 and a sensor plate 12. Sensor pin 11 is essentially cylindrical. Sensor pin 12 is movable in at least two actuation directions. Sensor plate 12 is connected to the lower end portion of sensor pin 11. As a result of this connection, sensor plate 12 moves relative to circuit board 20 in correspondence with the movement of sensor pin 12.

Sensor plate 12 is a metal sensor plate. As indicated, sensor plate 12 swivels together with sensor pin 11 during swiveling of the longitudinal axis of sensor pin 11. As a result, the relative position of sensor plate 12 with respect to conductor surfaces 21 situated on circuit board 20 changes.

Portions of sensor plate 12 together with conductor surfaces 21 form capacitors whose capacitance values change with the swiveling of sensor plate 12. These changes in capacitance may be evaluated by an electronics system (not shown) in order to determine the change in position of sensor plate 12, and thus the actuating force that acts on sensor pin 11. The swiveling of sensor pin 11 may take place manually, such as by an operator, for example, by means of an attached button cap (not shown).

The lower portion of sensor element 10 is made up of an originally square or rectangular metal plate from which strip-shaped support elements 13, 14, 15, 16 have been cut free in the direction of the diagonals of the metal plate. The end portions of strip-shaped support elements 13, 14, 15, 16 form screw eyes 17 and centering eyes 18, 19. Centering eyes 18, 19 used for centering the sensor element 10 are designed as a hole 18 and an elongated hole 19.

The portion of the metal plate that is integrally connected to strip-shaped support elements 13, 14, 15, 16 forms an approximately cloverleaf-shaped sensor plate 12 with four sensor wings 12a oppositely situated in pairs. The center of sensor plate 12 is fixedly connected to the vertically protruding cylindrical sensor pin 11.

After installation, sensor element 10 is situated at the top side of circuit board 20, screw eyes 17 being connected by screwing to mounting holes 23. For precise positioning of sensor element 10, in addition centering pins 22 situated at the top side of circuit board 20 are inserted into centering eyes 18, 19 of sensor element 10.

Sensor wings 12a, in the neutral position of sensor element 10, are bent upward slightly in comparison to the plane that is spanned by strip-shaped support elements 13, 14, 15, 16 to allow a relative movement in all possible tilting directions.

LIST OF REFERENCE NUMERALS

10 sensor element
11 sensor pin
12 sensor plate
12a sensor wing
13, 14, 15, 16 strip-shaped support elements
17 screw (screw-on) eyes
18, 19 centering eyes
18 hole
19 elongated hole
20 circuit board
21 conductor surfaces
22 centering pins
23 screw holes (mounting holes)

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A multidirectional force sensor comprising:
   a sensor pin movable in at least two actuation directions;
   a cloverleaf-shaped sensor plate integrally connected to a plurality of strip-shaped support elements, the cloverleaf-shaped sensor plate having a plurality of sensor plate wings oppositely situated in pairs, each strip-shaped support element having an end portion with an opening, wherein the cloverleaf-shaped sensor plate and the strip-shaped support elements are cut free in one piece from a rectangular metal plate in directions of diagonals of the rectangular metal plate with the sensor plate wings being between the strip-shaped support elements;
   a circuit board; and
   the cloverleaf-shaped sensor plate is connected to the sensor pin to move relative to the circuit board in correspondence with movement of the sensor pin.

2. The multidirectional force sensor of claim 1 wherein: the sensor pin is metallic.

3. The multidirectional force sensor of claim 1 wherein: the sensor pin and the cloverleaf-shaped sensor plate are made of a same type of metal.

4. The multidirectional force sensor of claim 1 wherein: the sensor pin is movable from a neutral position in the at least two actuation directions and the sensor pin moves to the neutral position when an actuating force is discontinued.

5. The multidirectional force sensor of claim 1 wherein: the cloverleaf-shaped sensor plate moves against the circuit board in moving relative to the circuit board in correspondence with movement of the sensor pin.

6. The multidirectional force sensor of claim 1 wherein: the circuit board has an electrical measuring system configured to detect a position of the cloverleaf-shaped sensor plate relative to the circuit board.

7. The multidirectional force sensor of claim 1 wherein: the circuit board has a plurality of conductor surfaces thereon; and
capacitances between the cloverleaf-shaped sensor plate and the conductor surfaces on the circuit board depend on a position of the cloverleaf-shaped sensor plate relative to the circuit board whereby the position of the cloverleaf-shaped sensor plate is detectable from the capacitances between the cloverleaf-shaped sensor plate and the conductor surfaces on the circuit board.

8. The multidirectional force sensor of claim 7 wherein: the cloverleaf-shaped sensor plate moves against the conductor surfaces on the circuit board in moving relative to the circuit board in correspondence with movement of the sensor pin.

9. The multidirectional force sensor of claim 1 wherein: the opening of the end portion of each of at least two of the strip-shaped support elements forms a screw eye.

10. The multidirectional force sensor of claim 9 wherein: each screw eye is screwed to the circuit board.

11. The multidirectional force sensor of claim 1 wherein: the opening of the end portion of each of at least one of the strip-shaped support elements forms a centering eye.

12. The multidirectional force sensor of claim 11 wherein: each centering eye cooperates with a centering pin of the circuit board.

13. The multidirectional force sensor of claim 11 wherein: each centering eye is an elongated hole.

14. The multidirectional force sensor of claim 1 wherein: the opening of the end portion of each of at least two of the strip-shaped support elements forms a screw eye, each screw eye is screwed to the circuit board; and
the opening of the end portion of each of at least another one of the strip-shaped support elements forms a centering eye, each centering eye cooperates with a centering pin of the circuit board.

15. The multidirectional force sensor of claim 1 wherein: the rectangular metal plate is a square metal.

16. A multidirectional force sensor comprising:
   a sensor element having a sensor pin and a cloverleaf-shaped sensor plate, the cloverleaf-shaped sensor plate being movable relative to a circuit board in correspondence with the sensor pin being actuated by an operator; and the cloverleaf-shaped sensor plate being integrally connected to a plurality of strip-shaped support elements, the cloverleaf-shaped sensor plate having a plurality of sensor plate wings oppositely situated in pairs, each strip-shaped support element having an end portion with an opening, wherein the cloverleaf-shaped sensor plate and the strip-shaped support elements are cut free in one piece from a rectangular metal plate in directions of diagonals of the rectangular metal plate with the sensor plate wings being between the strip-shaped support elements.

17. The multidirectional force sensor of claim 16 wherein:
the cloverleaf-shaped sensor plate moves against the circuit board in moving relative to the circuit board in correspondence with actuation of the sensor pin.

18. The multidirectional force sensor of claim 16 wherein:
capacitances between the sensor plate and conductor surfaces on the circuit board depend on a position of the cloverleaf-shaped sensor plate relative to the circuit board whereby the position of the cloverleaf-shaped sensor plate is detectable from the capacitances between the sensor plate and the conductor surfaces on the circuit board.

19. The multidirectional force sensor of claim 16 wherein:
the opening of the end portion of each of at least two of the strip-shaped support elements forms a screw eye, each screw eye is screwed to the circuit board; and
the opening of the end portion of each of at least another one of the strip-shaped support elements forms a centering eye, each centering eye cooperates with a centering pin of the circuit board.

20. The multidirectional force sensor of claim 16 wherein:
the rectangular metal plate is a square metal plate.

* * * * *